United States Patent
Tsai et al.

(10) Patent No.: US 8,193,541 B2
(45) Date of Patent: Jun. 5, 2012

(54) LIGHT EMITTING DIODE STRUCTURE HAVING A CONDUCTIVE THIN FILM FOR CONNECTING A LIGHT EMITTING STACK TO AN ELECTRODE AND LED PACKAGING STRUCTURE USING THE SAME

(75) Inventors: Yao-Jun Tsai, Jhongli (TW); Chen-Peng Hsu, Kaohsiung (TW); Hung-Lieh Hu, Hsinchu (TW); Ji-Feng Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/980,593

(22) Filed: Dec. 29, 2010

(65) Prior Publication Data
US 2011/0133229 A1 Jun. 9, 2011

Related U.S. Application Data

(62) Division of application No. 12/364,536, filed on Feb. 3, 2009, now Pat. No. 7,883,910.

(51) Int. Cl.
*H01L 33/00* (2010.01)
*H01L 33/18* (2010.01)

(52) U.S. Cl. ............... 257/81; 257/13; 257/79; 257/98; 257/99; 438/22; 438/39

(58) Field of Classification Search .................... 257/81
See application file for complete search history.

(56) References Cited

U.S. PATENT DOCUMENTS

| | | | |
|---|---|---|---|
| 6,121,635 A * | 9/2000 | Watanabe et al. | 257/91 |
| 6,476,551 B1 * | 11/2002 | Osawa et al. | 313/506 |
| 7,256,483 B2 | 8/2007 | Epler et al. | |
| 7,282,741 B2 | 10/2007 | Kim et al. | |
| 7,597,823 B2 * | 10/2009 | Tamaki et al. | 252/301.4 F |
| 7,812,454 B2 | 10/2010 | Gogoi | |
| 2005/0133807 A1 | 6/2005 | Park et al. | |
| 2005/0205887 A1 * | 9/2005 | Shei et al. | 257/99 |
| 2006/0091409 A1 | 5/2006 | Epler et al. | |
| 2006/0102918 A1 * | 5/2006 | Su et al. | 257/99 |
| 2006/0138436 A1 * | 6/2006 | Chen et al. | 257/98 |
| 2006/0240585 A1 * | 10/2006 | Epler et al. | 438/22 |

(Continued)

OTHER PUBLICATIONS

Kim, "Effect of film thickness on the properties of indium tin oxide thin films", Journal of Applied Physics, vol. 88, p. 6021 (2000).*

*Primary Examiner* — N Drew Richards
*Assistant Examiner* — Peter Bradford
(74) *Attorney, Agent, or Firm* — Thomas|Kayden

(57) ABSTRACT

A light emitting diode (LED) structure and a LED packaging structure are disclosed. The LED structure includes a sub-mount, a stacked structure, an electrode, an isolation layer and a conductive thin film layer. The sub-mount has a first surface and a second surface opposite the first surface. The stacked structure has a first semiconductor layer, an active layer and a second semiconductor layer that are laminated on the first surface. The electrode is disposed apart from the stacked structure on the first surface. The isolation layer is disposed on the first surface to surround the stacked structure as well as cover the lateral sides of the active layer. The conductive thin film layer connects the electrode to the stacked structure and covers the stacked structure.

40 Claims, 15 Drawing Sheets

U.S. PATENT DOCUMENTS

| | | |
|---|---|---|
| 2006/0255358 A1 | 11/2006 | Shum |
| 2006/0284208 A1 | 12/2006 | Kang et al. |
| 2007/0085089 A1 | 4/2007 | Hsu |
| 2007/0194343 A1 | 8/2007 | Jang et al. |
| 2007/0205426 A1* | 9/2007 | Inoshita et al. ............... 257/99 |
| 2007/0246716 A1 | 10/2007 | Bhat et al. |
| 2007/0254394 A1 | 11/2007 | Seo et al. |
| 2007/0292979 A1* | 12/2007 | Hata et al. ............... 438/22 |
| 2008/0128731 A1* | 6/2008 | DenBaars et al. ............... 257/98 |
| 2008/0251808 A1* | 10/2008 | Kususe et al. ............... 257/98 |
| 2009/0200560 A1* | 8/2009 | Lin et al. ............... 257/79 |

* cited by examiner

LIGHT EMITTING DIODE STRUCTURE HAVING A CONDUCTIVE THIN FILM FOR CONNECTING A LIGHT EMITTING STACK TO AN ELECTRODE AND LED PACKAGING STRUCTURE USING THE SAME

This application is a divisional application of U.S. application Ser. No. 12/364,536, filed Feb. 3, 2009, now U.S. Pat. No. 7,883,910, the contents of which are incorporated herein by reference.

BACKGROUND OF THE DISCLOSURE

1. Field of the Disclosure

The disclosure relates in general to light emitting diode (LED) structure, and more particularly to LED structure with high efficiency and LED packaging structure using the same and method of forming the same.

2. Description of the Related Art

Conventional method for manufacturing a thin film light emitting diode (LED) would bond a complete wafer, which will be diced to form a plurality of LEDs afterwards, on a substrate by heating the substrate and the wafer thereon. If the wafer has a non-uniform surface, the wafer is prone to fracture on the process of bonding. Besides, the conventional bonding temperature is about 400° C. and is regarded as a high temperature that would influence the quality of the wafer. Therefore, after the substrate and the wafer are bonded together and cooled down to a room temperature, a non-uniform stress distribution would occur to the wafer, weakening the structure of the wafer, and further affecting the sequential manufacturing process of LEDs.

At present, a conventional thin film LED normally has the problem of limited light emitting efficiency due to the deposition of metal electrode. For example, the metal electrode is directly disposed on the light emitting surface of the thin film LED. Thus, for a 12-mil LED, one-third light emitting area is usually lost due to the metal electrode. And for a 40-mil LED, one-ninth light emitting area is wasted. Besides, the electric current on the connection portion between the LED and the metal electrode is normally the highest, and is likely to cause energy loss.

SUMMARY OF THE DISCLOSURE

It is therefore an object of the disclosure to provide a LED structure, a LED packaging structure using the same and a method of forming the same to facilitate the manufacturing process, to reduce the manufacturing cost, to effectively increase light emitting efficiency, and further to provide an ESD protection function.

The disclosure achieves the above-identified object by providing a LED structure that includes a sub-mount, a stacked structure, an electrode, an isolation layer and a conductive thin film layer. The sub-mount has a first surface and a second surface opposite the first surface. The stacked structure has a first semiconductor layer, an active layer and a second semiconductor layer that are laminated on the first surface. The electrode is disposed apart from the stacked structure on the first surface. The isolation layer is disposed on the first surface and surrounds the stacked structure as well as covers the lateral sides of the active layer. The conductive thin film layer connects the electrode to the stacked structure.

The disclosure achieves the above-identified object also by providing a LED packaging structure that includes a packaging substrate, at least one stacked structure, at least one first electrode, at least one second electrode, an isolation layer, at least one conductive thin film layer, and a transparent sealant. The at least one stacked structure has a first semiconductor layer, an active layer and a second semiconductor layer that are laminated on a surface of the packaging structure. The at least one first electrode is disposed apart from the at least one stacked structure on the surface. The at least one second electrode is disposed on the packaging substrate and electrically connected the at least one stacked structure. The isolation layer is disposed on the surface and surrounds the at least one stacked structure as well as covers the lateral sides of the active layer. The at least one conductive thin film layer connects the at least one first electrode to the at least one stacked structure, and covers the at least one stacked structure. The transparent sealant covers the at least one conductive thin film layer.

The disclosure achieves the above-identified object further by providing a method of forming a LED structure. The method includes the steps stated below. An electrostatic discharge (ESD) protection element is formed on a sub-mount, wherein the ESD protection element is disposed along the edges of a first surface on the sub-mount and is embedded in the sub-mount. Then, a first electrode is formed on the ESD protection element. Next, a stacked structure is provided and bonded on the first surface of the sub-mount, wherein the stacked structure is located apart from the first electrode. Then, an isolation layer is formed on the first electrode, the stacked structure and the space between the first electrode and the stacked structure. Next, part of the isolation layer over the first electrode and part of the isolation layer over the stacked structure are removed to expose the first electrode and the stacked structure. Then, a conductive thin film layer is formed on the first electrode and the stacked structure for electrically connecting the first electrode to the stacked structure. Next, a second electrode is formed on a second surface of the sub-mount opposite the first surface. Then, the sub-mount is diced to form a LED structure.

The disclosure achieves the above-identified object further by providing a method of forming a LED structure. The method comprises the steps of: forming a first electrode on a sub-mount, wherein the first electrode is disposed along the edges of a first surface on the sub-mount; providing a stacked structure and bonding the stacked structure on the first surface of the sub-mount, wherein the stacked structure is located apart from the first electrode; forming an isolation layer on the first electrode, the stacked structure and the space between the first electrode and the stacked structure; removing part of the isolation layer over the first electrode and part of the isolation layer over the stacked structure to expose the first electrode and the stacked structure; forming a conductive thin film layer on the first electrode and the stacked structure for electrically connecting the first electrode to the stacked structure; forming a second electrode on a second surface of the sub-mount opposite the first surface; and dicing the sub-mount to form a LED structure.

Other features of the disclosure will become apparent from the following detailed description of the preferred but non-limiting embodiments. The following description is made with reference to the accompanying drawings.

DETAILED DESCRIPTION OF THE DISCLOSURE

Figure 1A:
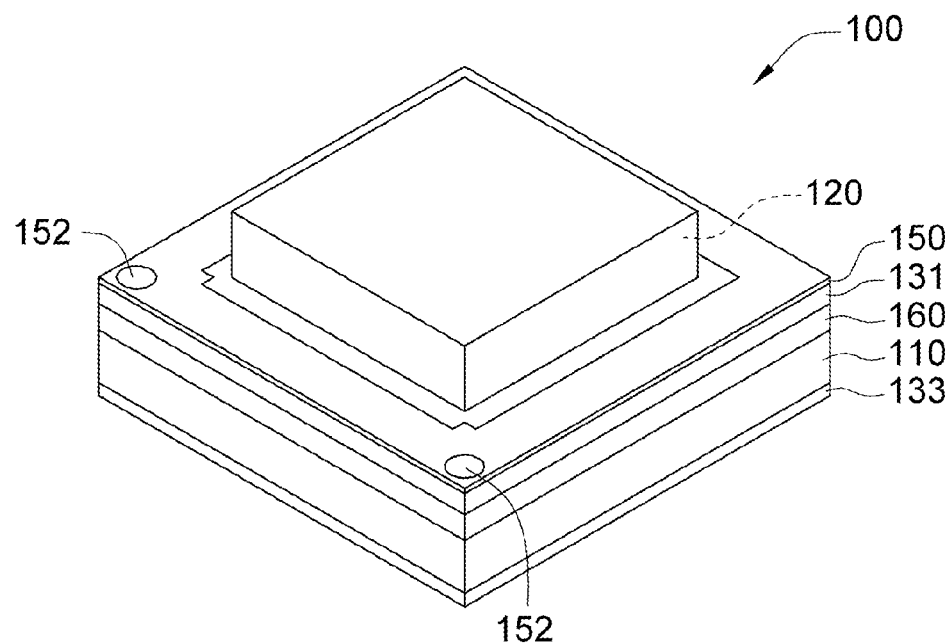
FIG. 1A is a diagram showing a light emitting diode (LED) structure according to a preferred embodiment of the disclosure.
Figure 1B:
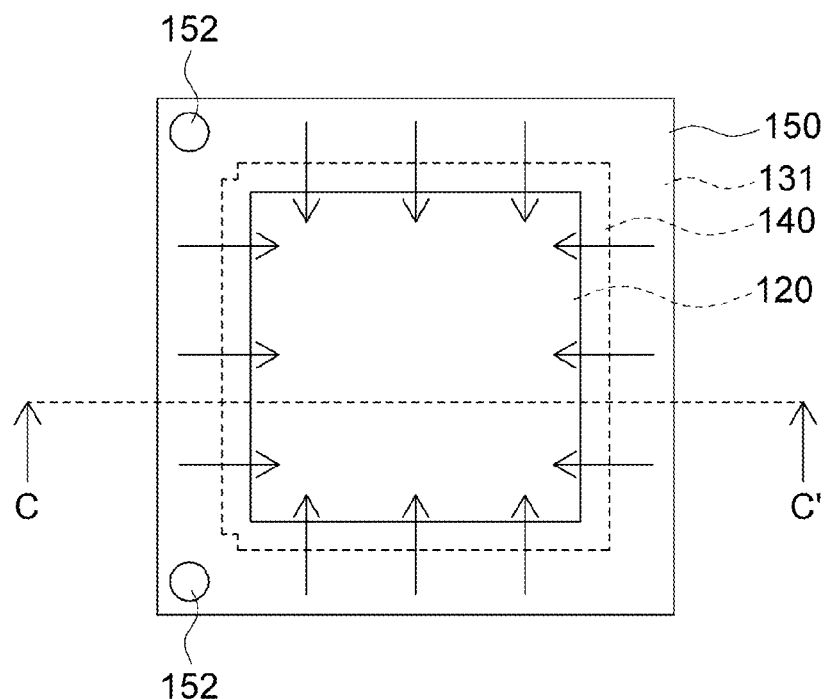
FIG. 1B is a diagram showing the top view of the LED structure in FIG. 1A.
Figure 1C:
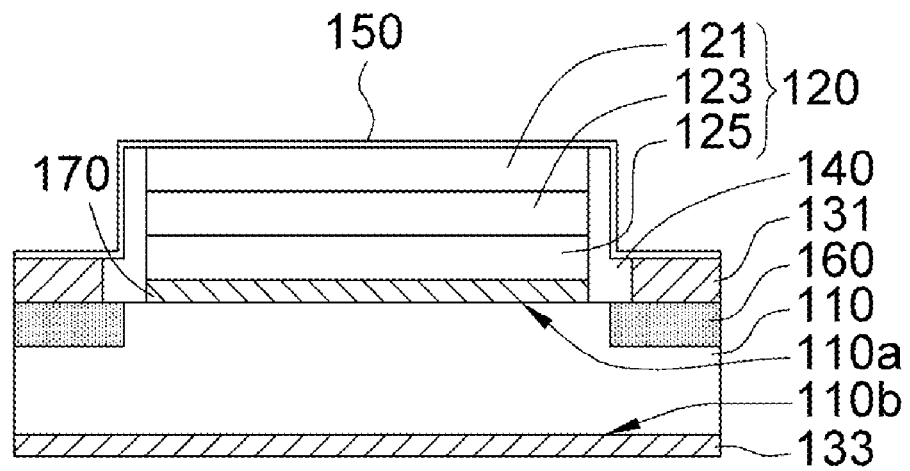
FIG. 1C is a diagram showing the c-c' cross-sectional view of the LED structure in FIG. 1A.

FIG. 1A is a diagram showing a light emitting diode (LED) structure 100 according to a preferred embodiment of the disclosure. FIG. 1B is a diagram showing the top view of the LED structure 100 in FIG. 1A. FIG. 1C is a diagram showing the c-c' cross-sectional view of the LED structure 100 in FIG. 1A. The LED structure 100 includes a sub-mount 110, a stacked structure 120, an electrode 131, an isolation layer 140 and a conductive thin film layer 150. As shown in FIG. 1C, the sub-mount 110 has a first surface 110a and a second surface 110b opposite the first surface 110a. The stacked structure 120 has a first semiconductor layer 121, an active layer 123 and a second semiconductor layer 125 that are laminated on the first surface 110a. The electrode 131 is disposed apart from the stacked structure 120 on the first surface 110a. The isolation layer 140 surrounds the stacked structure 120 as well as covers the lateral sides of the stacked structure 120 on the first surface 110a. The conductive thin film layer 150 connects the electrode 131 to the stacked structure 120.

In the embodiment, the conductive thin film layer 150 totally covers the electrode 131, the isolation layer 140 and the stacked structure 120, for example, for electrically connecting the electrode 131 to the stacked structure 120. However, the disclosure is not limited thereto, the conductive thin film layer 150 can just cover a part of the electrode 131. Furthermore, the conductive thin film layer 150 has weak adhesion for attaching to other elements such as metal bumps, which are used for wire bonding. Preferably, as shown in FIG. 1A, a plurality of metal pads 152 are disposed on the conductive thin film layer 150 to assist the conductive thin film layer 150 in connecting with metal bumps. The metal pads 152 can be formed on the conductive thin film layer 150 by plating. Or, the conductive thin film layer 150 can be partially removed by, for example, etching, to expose parts of the electrode 131, such that the exposed parts of the electrode 131 can be used as the metal pads 152.

In the embodiment, although the isolation layer 140 surrounds all the lateral sides of the stacked structure 120 (shown in FIG. 1C) and the conductive thin film layer 150 covers the isolation layer 140 and the stacked structure 120, the disclosure is not limited thereto. The isolation layer 140 needs only to cover the lateral sides of the active layer 123. Besides, the isolation layer 140 can merely be disposed along three lateral sides of the stacked structure 120, and the conductive thin film layer 150 can just cover a part of the isolation layer 140 and the stacked structure 120.

The LED structure 100 further includes an electrostatic discharge (ESD) protection element 160, another electrode 133 and an interface layer 170. The ESD protection element 160 is disposed under the electrode 131 and embedded in the sub-mount 110. The electrode 133 is disposed on the second surface 110b of the sub-mount 110. The interface layer 170 is disposed between the stacked structure 120 and the sub-mount 110.

The active layer 123 has a p-n junction region for emitting light when applied by a bias voltage, and the first and second semiconductor layers 121, 125 are used as cladding layers for the active layer 123. In the preferred embodiment, the first semiconductor layer 121 is a single layer that includes, for example, an n-type semiconductor such as n-GaN, and the second semiconductor layer 125 is also a single layer that includes, for example, a p-type semiconductor such as p-GaN. However, the disclosure is not limited thereto. Each of the first and second semiconductor layers 121, 125 can also be multi-layer structure, such as a NPN structure or a PNP structure.

Figure 2:
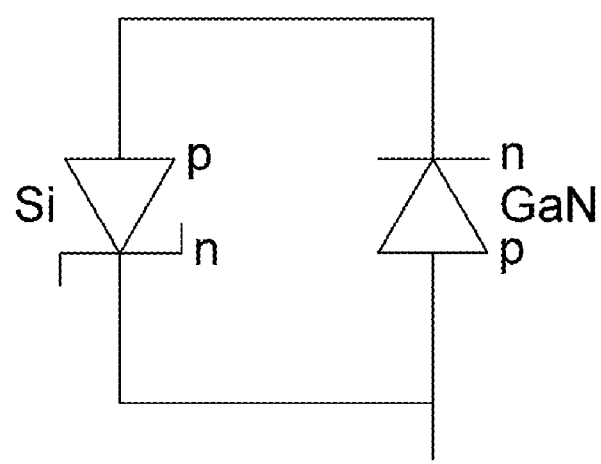
FIG. 2 is a circuit diagram showing the electrical connection of the stacked structure, the sub-mount and the ESD protection element.

In the embodiment, the electrode 131 is disposed along all the lateral sides of the stacked structure 120, as shown in FIG. 1B. The material of the electrodes 131 and 133 is, for example, metal, such as Cu, Ag, Au etc. And since the electrodes 131 and 133 are disposed on two opposite sides (shown in FIG. 1C) of the sub-mount 110, the sub-mount 110 is preferably conductive. For example, the material of the sub-mount 110 is a doped semiconductor. Further considering the composition of the stacked structure 120, the sub-mount 110 is preferably formed by n-type silicon. And the material of the ESD protection element 160 is preferably a p-type silicon, so as to form a p-n junction with the sub-mount 110. FIG. 2 is a circuit diagram showing the electrical connection of the stacked structure, the sub-mount and the ESD protection element. The p-n junction between the ESD protection element 160 and the sub-mount 110 is served as a Zener diode that requires a high reverse bias voltage to cross, so the ESD protection element 160 is capable of avoiding electric current flowing in the direction from the sub-mount 110 to the electrode 131, hence providing an ESD protection function for the LED structure 100.

In addition, as the electrode 131 is disposed along all the lateral sides of the stacked structure 120, the stacked structure 120 is not covered by the electrode 131 and its whole top surface is served as light emitting area, producing the largest light emitting effect.

The electrode 133 is disposed on the different side from the electrode 131 in the embodiment. However, the electrode 133 also can be disposed on the same side as the electrode 131 but located apart from the electrode 131 to avoid unnecessary electrical connection, so the material of the sub-mount 110 is not limited to be conductive and can be formed by any un-doped semiconductor or ceramic material.

The material of the isolation layer 140 disposed between the electrode 131 and the stacked structure 120 is, for example, silicon oxide for preventing the stacked structure 120 from directly connecting the electrode 131. The light transmittance of the conductive thin film layer 150 for a primary wavelength of the light generated by the active layer 123 is greater than 60%. In addition, the material of the conductive thin film layer 150 is selected from one group consisted of $In_2O_3$, $SnO_2$, ZnO, CdO, TiN, $In_2O_3$:Sn(ITO), ZnO:In(IZO), ZnO:Ga(GZO), ZnO:Al(AZO), $SnO_2$:F, $TiO_2$:Ta, $In_2O_3$—ZnO, $CdIn_2O_4$, $Cd_2SnO_4$, $Zn_2SnO_4$, $Mg(OH)_2$—C, ITO, IZO, GZO, AZO, ATO, FTO, NiO, and an allay consisted of the above elements. Preferably, the material of the conductive thin film layer 150 is selected from one group consisted of ITO, IZO, GZO, AZO, ATO, FTO, NiO, and an alloy consisted of the above elements. The interface layer 170 between the stacked structure 120 and the sub-mount 110 can be served either as an adhesive layer or as a reflector layer in the LED structure 100, however the disclosure is not limited thereto. The interface layer 170 can provide both an adhesive function and a reflective function for the stacked structure 120. For example, the interface layer 170 includes a metal reflector for reflecting the light generated by the active layer 123. Moreover, the interface layer 170 further includes an adhesive for combining the stacked structure 120 and the sub-mount 110.

It is noted that, since the electrode 131 is disposed along all the lateral sides of the stacked structure 120 and is electrically connected to the stacked structure 120 by the conductive thin film layer 150, electric current flows inwardly in the direction from the electrode 131 to the stacked structure 120 when voltage is applied to the electrodes 131 and 133, avoiding the electric current concentrating on a single portion of the stacked structure 120. Thus, the energy loss of the applied voltage is reduced, and the energy usage is enhanced accordingly.

Figure 3A:
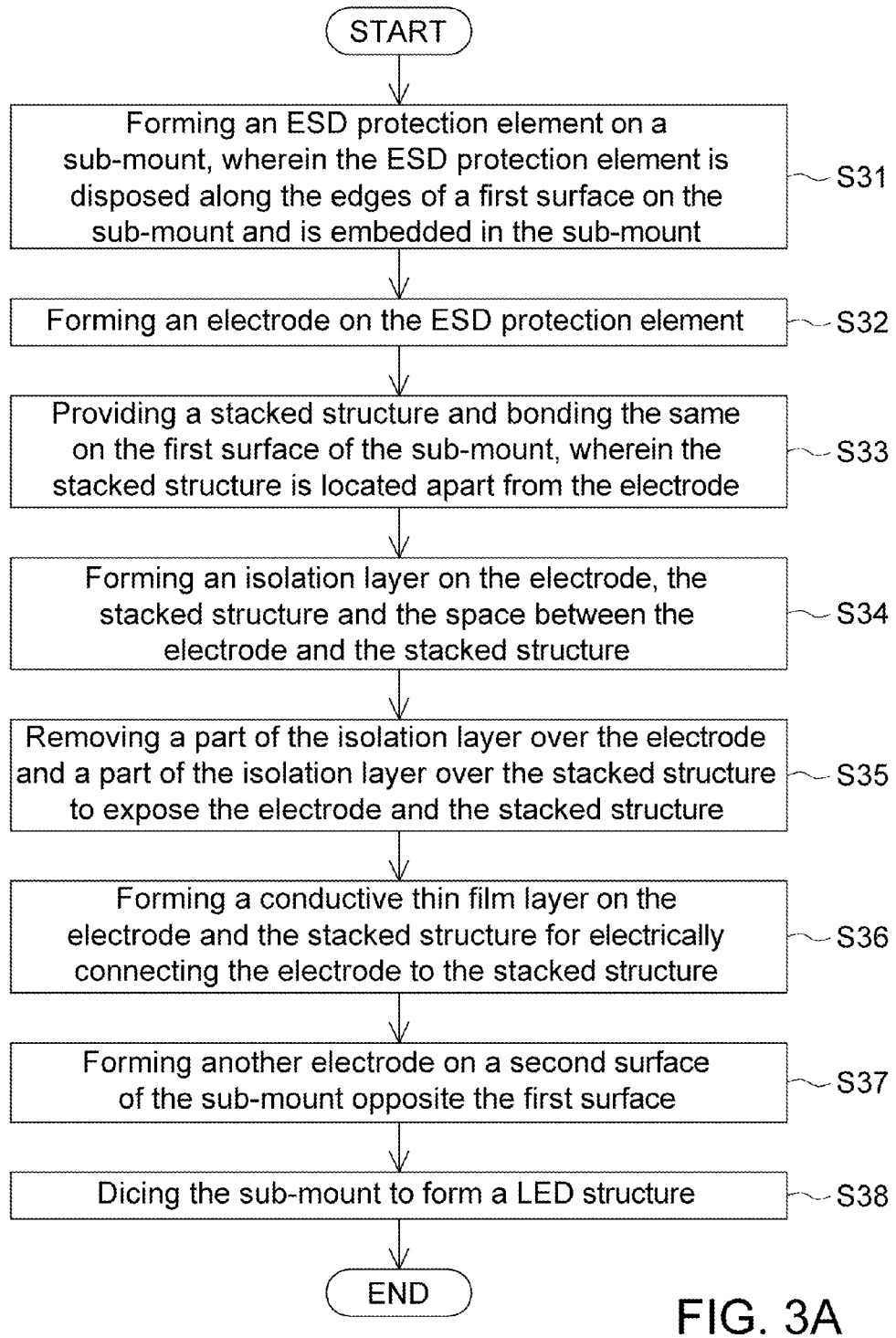
FIG. 3A is a flowchart showing a method of forming a LED structure according to a preferred embodiment of the disclosure.
Figure 4A:
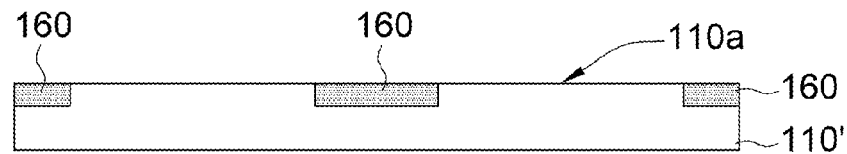
FIGS. 4A to 4G are diagrams sequentially showing the formation of a LED structure in accordance with the steps of the method in FIG. 3A.

FIG. 3A is a flowchart showing a method of forming a LED structure according to a preferred embodiment of the disclosure. The method includes steps S31 to S38 elaborated in the following accompanying with FIGS. 4A to 4G that sequentially show the formation of a LED structure in accordance with the steps of the method in FIG. 3A. In step S31, an ESD protection element is formed on a sub-mount, wherein the ESD protection element is disposed along the edges of a first surface on the sub-mount and is embedded in the sub-mount. As shown in FIG. 4A, when fabricating, a large-sized sub-mount 110' is normally provided and a plurality of areas on the large-sized sub-mount 110' are predetermined. The thickness of the large-sized sub-mount 110' is usually less than 200 micrometer in consideration of heat effect. A plurality of ESD protection elements 160 are formed on the large-sized sub-mount 110' and within the predetermined areas. Besides, the ESD protection elements 160 are disposed along the edges of the first surface 110a within each predetermined area of the large-sized sub-mount 110' and are embedded in the large-sized sub-mount 110'.

Figure 4B:
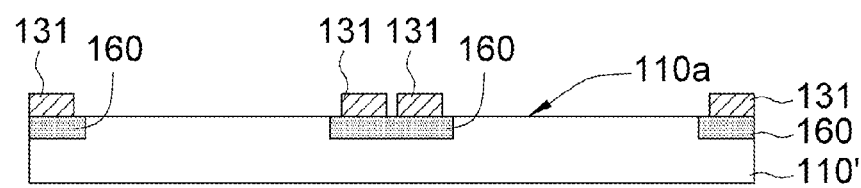

Next, in step S32, an electrode is formed on the ESD protection element. As shown in FIG. 4B, a plurality of electrodes 131 are formed on the first surface 110a in accordance with the ESD protection elements 160.

Figure 4C:
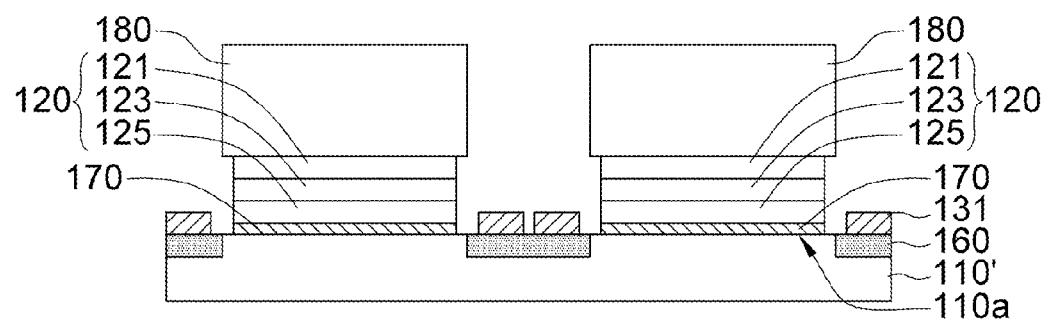

Then, the method proceeds to step S33 that a stacked structure is provided and is bonded on the first surface of the sub-mount, wherein the stacked structure is located apart from the electrode. In FIG. 4C, the stacked structure 120 and an interface layer 170 are formed on a temporary substrate 180 in advance before being bonded to the large-sized sub-mount 110'. The temporary substrate 180 is, for example, a sapphire ($Al_2O_3$) substrate. Normally, the materials of the first semiconductor layer 121, active layer 123, second semiconductor layer 125 and interface layer 170 are formed and laminated on a large-sized temporary substrate (not shown) in order, and then the large-sized temporary substrate and the materials thereon are diced to form a plurality of the temporary substrates 180 with the stacked structures 120 and interface layers 170. As shown in FIG. 4C, each temporary substrate 180, on which the stacked structure 120 and the interface layer 170 are loaded, is then reversed to face the first surface 110a of the large-sized sub-mount 110'. After that, the interface layer 170 and the large-sized sub-mount 110' can be bonded together by applying ultrasonic energy and heat onto the large-sized sub-mount 110'.

Due to the characteristic of ultrasonic wave, the bonding temperature in the embodiment ranges from about 100° C. to 200° C. The bonding temperature is much lower than conventional bonding temperature, which is about 400° C., causing least change to the quality of the LED structure, such as stress distribution, so the strength of the LED structure is maintained.

Figure 4D:
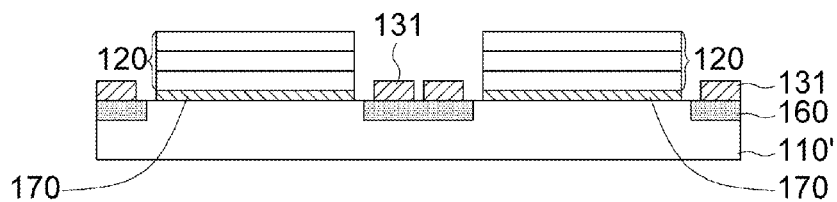

When the stacked structure 120 and interface layer 170 are fixed on the large-sized sub-mount 110', the temporary substrate 180 should be detached from the stacked structure 120. As the first semiconductor layer 121 is formed by n-GaN, a laser lift-off method can be used to detach the temporary substrate 180 due to the characteristic of n-GaN. For example, when the first semiconductor layer 121 is projected by a laser beam, the portion of the first semiconductor layer 121 that connects the temporary substrate 180 absorbs the energy of laser beam and then has decomposition reaction to generate nitrogen gas, loosing the connection between the first semiconductor layer 121 and the temporary substrate 180. It is noted that, because the temporary substrates 180 are small-sized after diced and are peeled off the stacked structures 120 respectively, each of the temporary substrates 180 produces less pulling force to the stacked structures 120 during the procedure of detaching, hence easing the damage to the stacked structures 120. Also, with the help of nitrogen gas, each of the temporary substrates 180 is more easily separated from the stacked structures 120. As shown in FIG. 4D, during the fabrication procedure, a plurality of stacked structures 120 are formed on the large-sized sub-mount 110' at the same time within the predetermined areas and located apart from the electrodes 131.

Figure 4E:
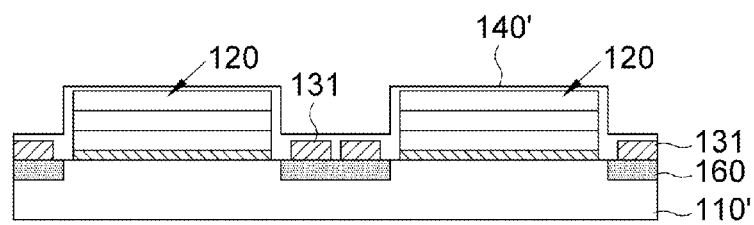

Next, in step S34, an isolation layer is formed on the electrode, the stacked structure and the space between the electrode and the stacked structure. As shown in FIG. 4E, an overall isolation layer 140' is formed over the electrodes 131, the stacked structures 120 and the spaces between the electrodes 131 and the stacked structures 120. The overall isolation layer 140' is mainly used for avoiding direct electrical connection between the stacked structures 120 and the electrodes 131. The overall isolation layer 140' can be formed by spinning or plasma enhanced chemical vapor deposition (PECVD).

Figure 4F:
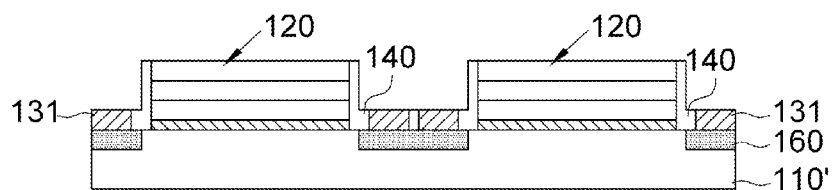

Then, in step S35, part of the isolation layer over the electrode and part of the isolation layer over the stacked structure are removed to expose the electrode and the stacked structure. As shown in FIG. 4E, the isolation layer 140' over the electrodes 131 and over the stacked structures 120 can be removed by etching, so as to detain the isolation layers 140 between the stacked structures 120 and the electrodes 131 on the sub-mount 110', as shown in FIG. 4F.

Figure 4G:
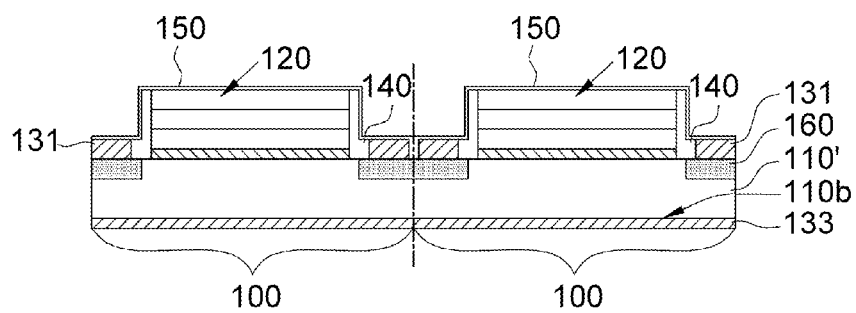

Next, in step S36, a conductive thin film layer is formed on the electrode and the stacked structure for electrically connecting the electrode to the stacked structure. As shown in FIG. 4G, conductive material such as ITO, IZO, GZO, AZO, ATO, FTO, NiO etc. is used and coated over the exposed surfaces of the electrodes 131 and stacked structures 120, as well as over the isolation layers 140, thereby forming a conductive thin film layer 150 to electrically connect the electrodes 131 with the stacked structures 120.

Then, in step S37, another electrode is formed on a second surface of the sub-mount opposite the first surface. As shown in FIG. 4G, an electrode 133 is formed on the second surface 110b of the large-sized sub-mount 110' and is opposite the electrodes 131. Herein the fabrication of a plurality of LED structures 100, which are not yet separated, is completed. Afterwards, as stated in step S38, the sub-mount is diced to form a LED structure. As shown in FIG. 4G, the large-sized sub-mount 110' are diced along the dashed lines (only one is shown for illustration) that are preferably in accordance with the edges of the predetermined areas, and then the manufacture of each individual LED structure 100 (shown in FIG. 1C) is finished.

Figure 3B:
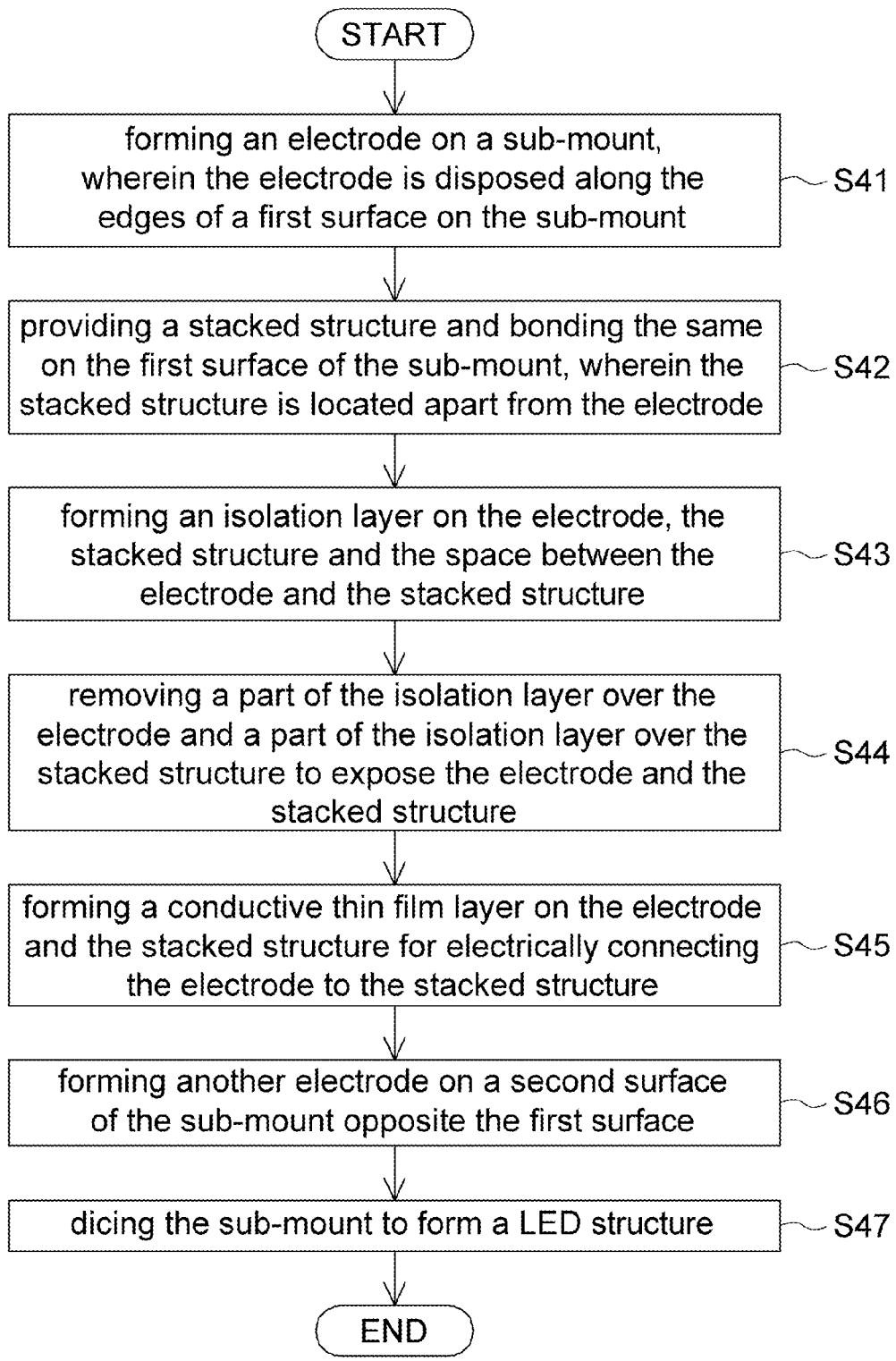
FIG. 3B is a flowchart showing a method of forming another LED structure according to a preferred embodiment of the disclosure.

FIG. 3B is a flowchart showing a method of forming another LED structure according to a preferred embodiment of the disclosure. The LED structure manufactured according to the method in FIG. 3B is different from the LED structure manufactured according to the method in FIG. 3A in the absence of ESD protection element. As shown in FIG. 3B, the method includes steps S41 to S47 that also can be elaborated by FIGS. 4A to 4G but the ESD protection elements in FIGS. 4A to 4G could be left out. In step S41, an electrode is formed on a sub-mount, wherein the electrode is disposed along the edges of a first surface on the sub-mount. Then, in step S42, a stacked structure is provided and bonded on the first surface of the sub-mount, wherein the stacked structure is located apart from the electrode. Next, in step S43, an isolation layer is formed on the electrode, the stacked structure and the space between the electrode and the stacked structure. Then, a part of the isolation layer over the electrode and a part of the isolation layer over the stacked structure are removed to expose the electrode and the stacked structure. Next, a conductive thin film layer is formed on the electrode and the stacked structure for electrically connecting the electrode to the stacked structure. Then, another electrode is formed on a second surface of the sub-mount opposite the first surface. Afterwards, the sub-mount is diced to form a LED structure.

Figure 5A:
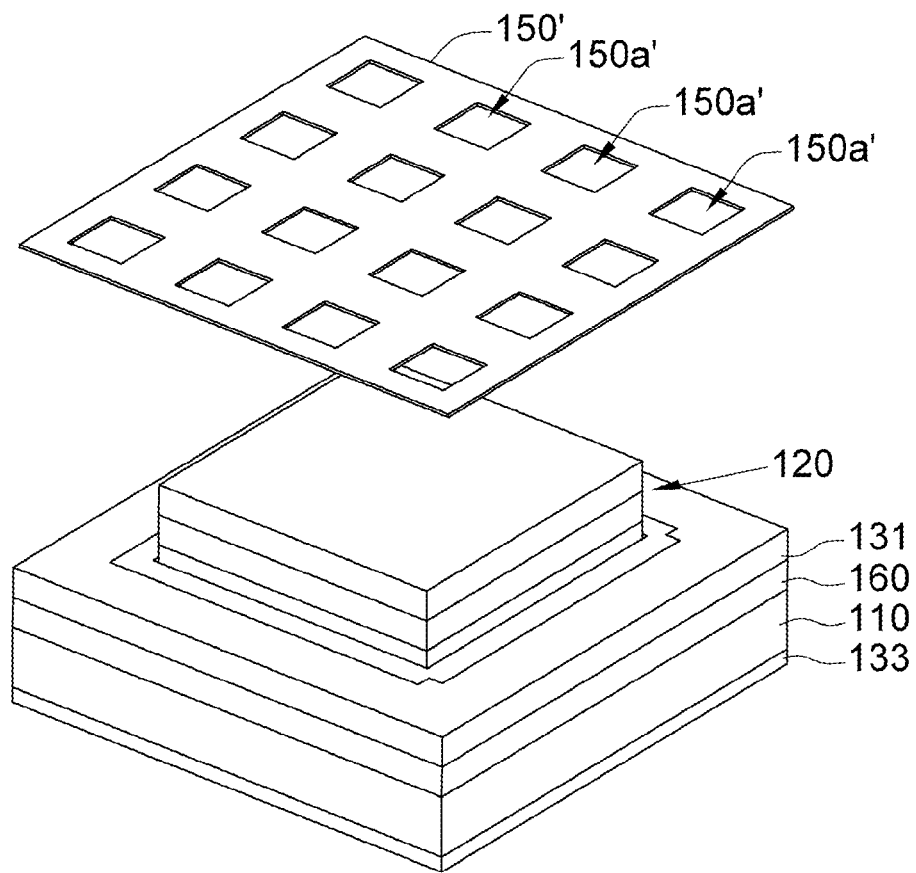
FIG. 5A is a diagram showing a conductive thin film layer with a plurality of openings.

In the above embodiment the conductive thin film layer 150 is an intact and uniform thin film layer, however the disclosure is not limited thereto. For example, the conductive thin film layer 150 can be designed as a thin film with openings or concaves that partially hollow out or thin out the conductive thin film layer 150. The openings or concaves are preferably located corresponding to the stacked structure 120 for changing the light transmission rate of the conductive thin film layer 150. FIG. 5A is a diagram showing a conductive thin film layer 150' with a plurality of openings 150a'. The openings 150a' do not block the light from the stacked structure 120, effectively improving the light transmission rate of the conductive thin film layer 150', and further enhancing the light usage of the stacked structure 120.

Figure 5B:
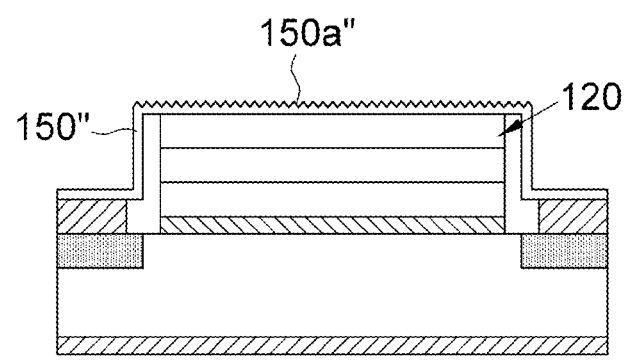
FIGS. 5B and 5C are diagrams each showing a conductive thin film layer with a light extracting feature.
Figure 5C:
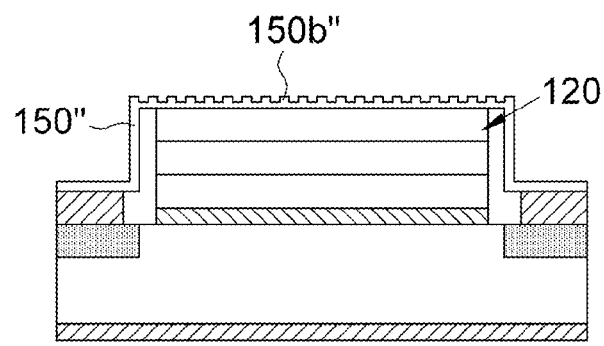

FIGS. 5B and 5C are diagrams each showing a conductive thin film layer 150" with a light extracting feature. As shown in FIG. 5B, the light extracting feature includes a plurality of sawteeth 150a". The sawteeth 150a" located above the top surface of the stacked structure 120 are, for example, microstructures that can be formed by roughening the outer surface of the conductive thin film layer 150". The light emitted from the stacked structure 120 is scattered in different directions by the sawteeth 150a" so as to increase the light emitting area of the stacked structure 120. As shown in FIG. 5C, the light extracting feature includes a plurality of pillars 150b". The pillars 150b" are, for example, nano-structures. Moreover, as a conductive thin film layer is designed to have concaves, the light extracting feature can also be formed on the surfaces within the concaves.

Figure 6:
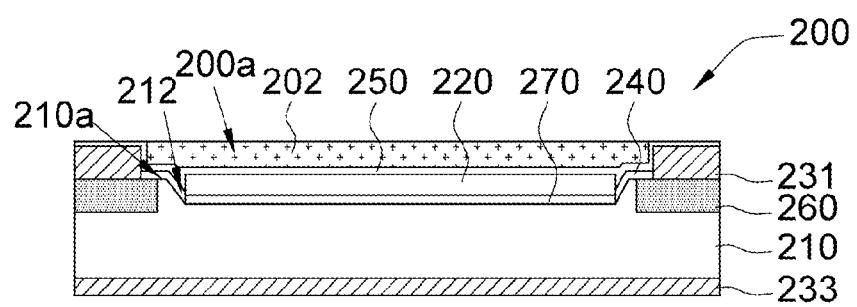
FIG. 6 is a diagram showing a LED structure filled with phosphor.

The LED structure disclosed in the above embodiment can further be used with phosphor for generating light of different color. FIG. 6 is a diagram showing a LED structure 200 filled with phosphor 202. The LED structure 200 includes a sub-mount 210, a stacked structure 220, two electrodes 231 and 233, an isolation layer 240, a conductive thin film layer 250, an ESD protection element 260 and an interface layer 270. The sub-mount 210 has a cavity 212 on its first surface 210a. The stacked structure 220 is disposed within the cavity 212 and is positioned lower than the top of the electrode 231. And as the electrode 231 is disposed on the lateral side of the stacked structure 220, there is a concave 200a formed on the LED structure 200. The concave 200a facilitates the conformal coating of phosphor due to the reason that the concave 200a can be fully filled with the phosphor 202 easily.

Figure 7A:
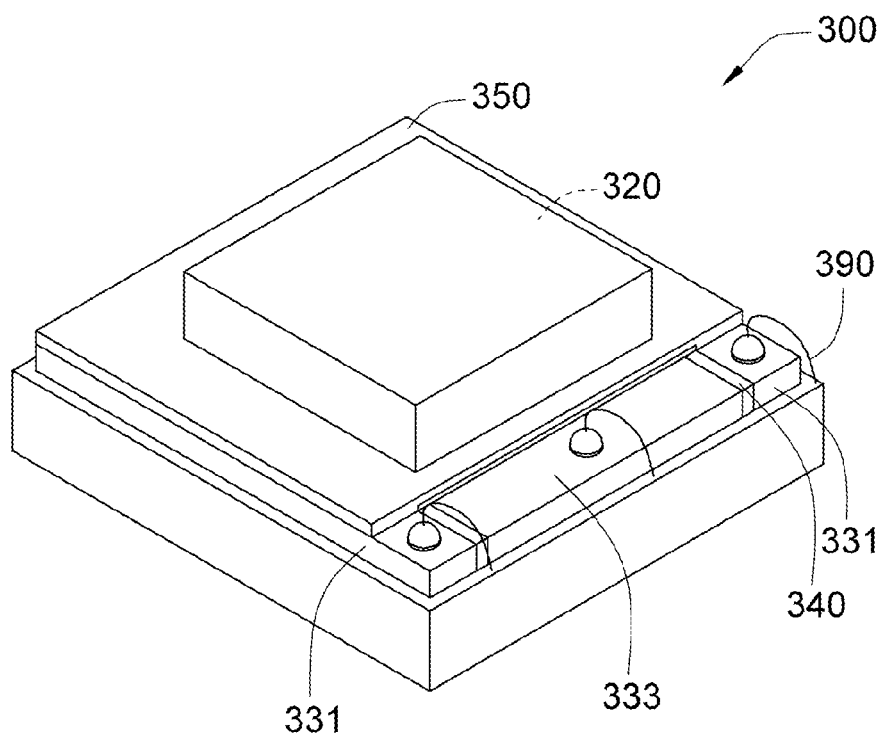
FIG. 7A is a diagram showing a LED structure having an electrode not fully surrounding its sacked structure.
Figure 7B:
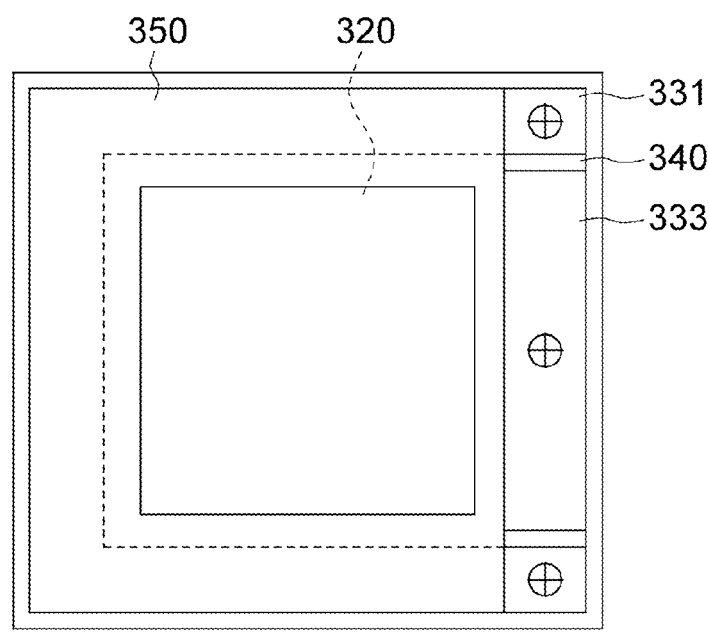
FIG. 7B is a diagram showing the top view of the LED structure in FIG. 7A.

As shown in FIG. 1B, the electrode 131 in the above embodiment is disposed along all lateral sides of the stacked structure 120, however the disclosure is not limited thereto. FIG. 7A is a diagram showing a LED structure 300 having an electrode 331 not fully surrounding its sacked structure 320, and FIG. 7B is a diagram showing the top view of the LED structure 300 in FIG. 7A. The electrode 331 of the LED structure 300 is disposed along three lateral sides of the stacked structure 320, and another electrode 333 is disposed on the unoccupied lateral side apart from the electrode 331 on the stacked structure 320. An isolation layer 340 is used for isolating the electrodes 331 and 333 and the stacked structure 320 to avoid unnecessary electrical connection. A conductive thin film 350 is disposed over the electrode 331 and the stacked structure 320. As the electrode 331 does not completely surround the LED structure 300, the LED structure 300 can be combined with other LED structures via a plurality of conductive lines 390, so as to produce a larger light emitting area.

Figure 8A:
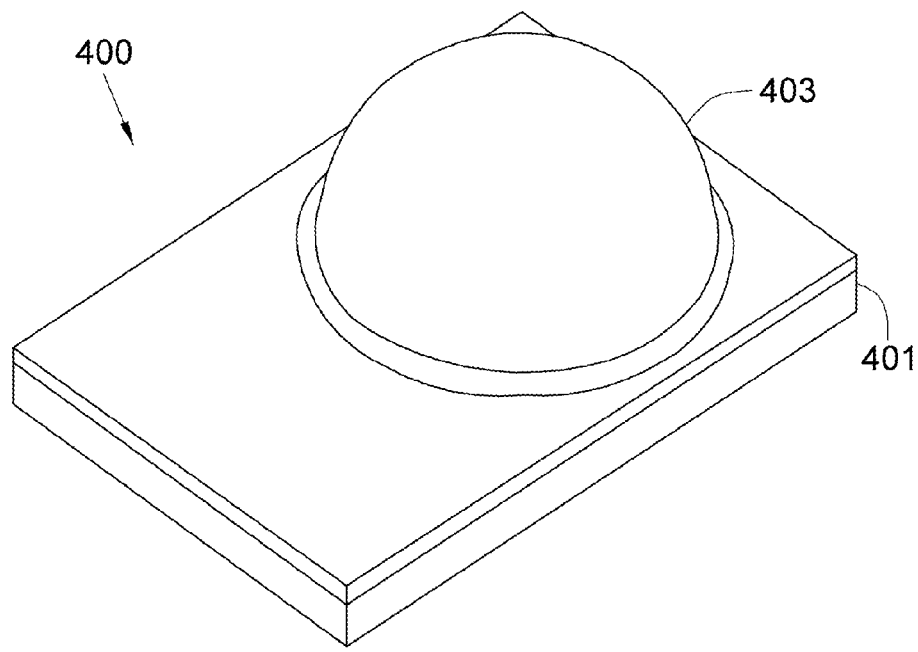
FIGS. 8A and 8B are diagrams showing a LED packaging structure according to a preferred embodiment of the disclosure.
Figure 8B:
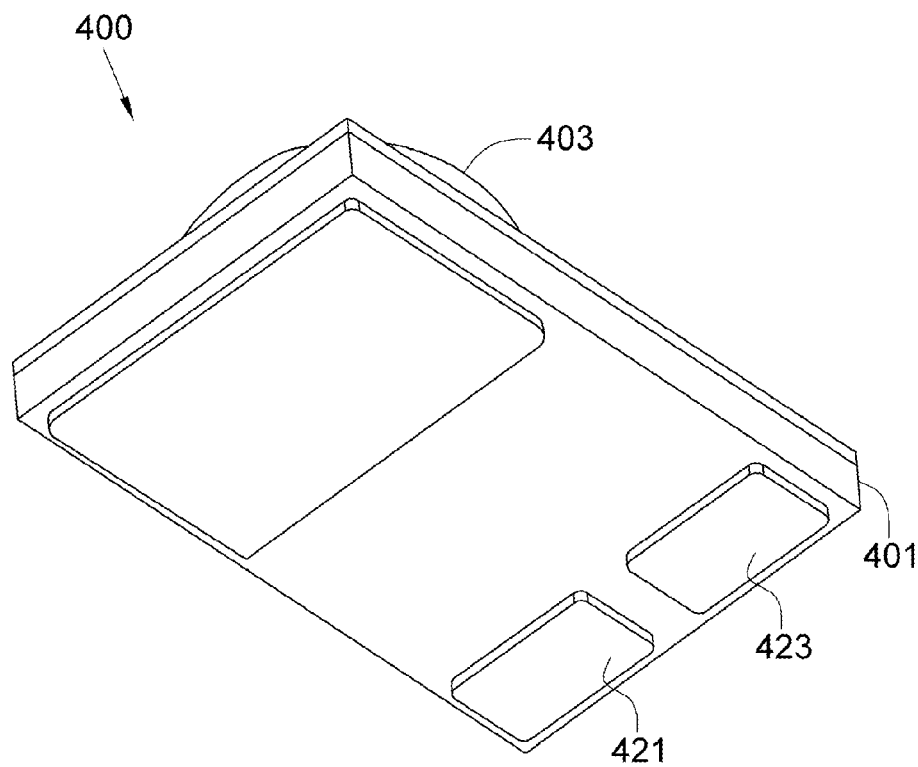
Figure 8C:
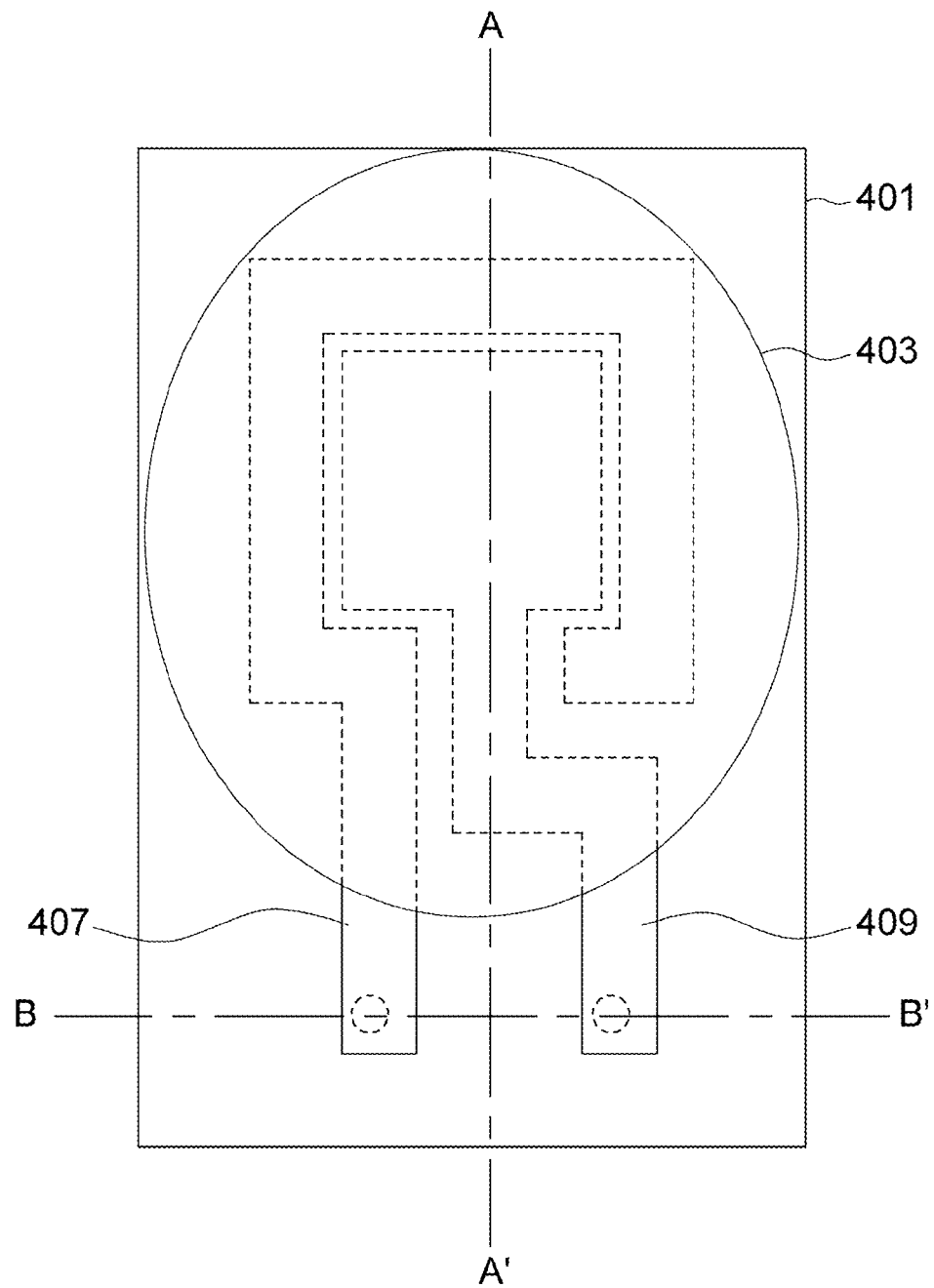
FIG. 8C is a top view of the LED packaging structure in FIG. 8A.
Figure 8D:
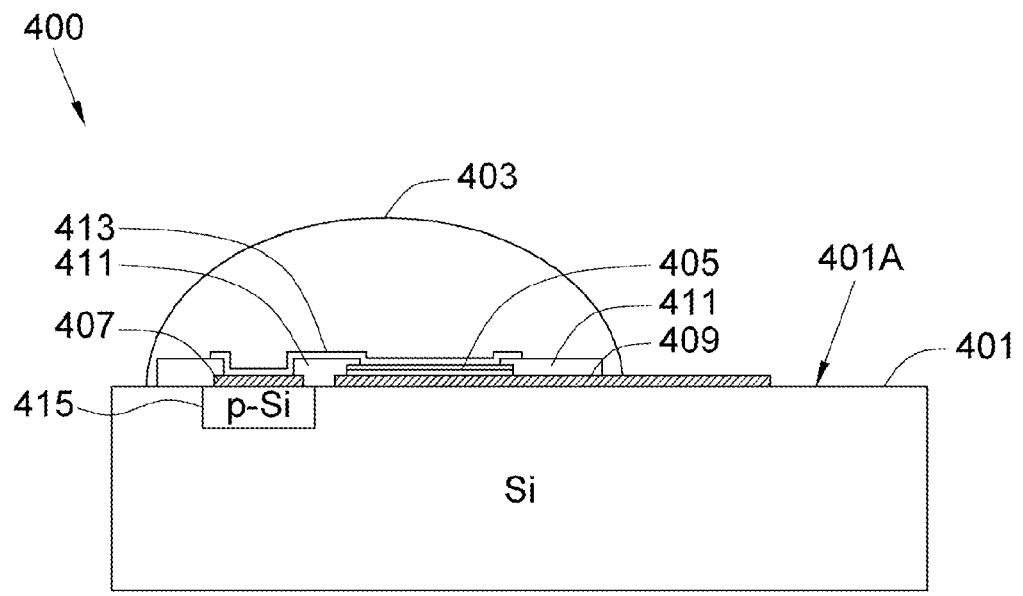
FIGS. 8D and 8E are cross-sectional views of the LED packaging structure in FIG. 8C along lines A-A' and B-B' respectively.
Figure 8E:
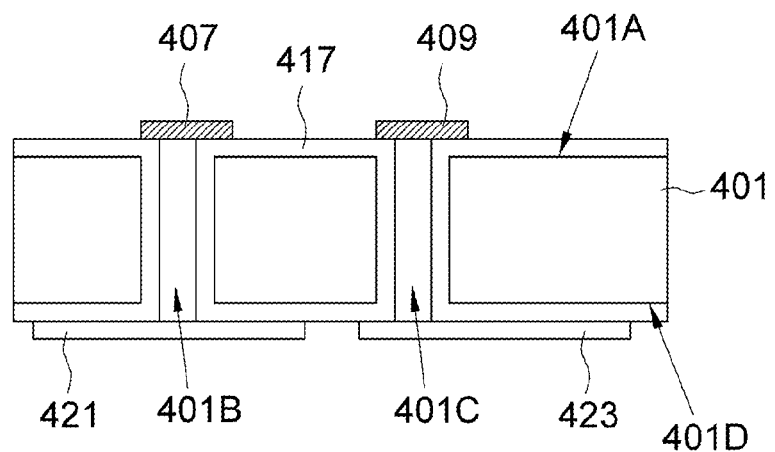

The design of lateral electrode can be applied to a LED package structure and is elaborated below by accompanying drawings. FIGS. 8A and 8B are diagrams showing a LED packaging structure according to a preferred embodiment of the disclosure. FIG. 8C is a top view of the LED packaging structure in FIG. 8A, and FIGS. 8D and 8E are cross-sectional views of the LED packaging structure in FIG. 8C along lines A-A' and B-B' respectively. In FIG. 8A, the LED packaging structure 400 includes a packaging substrate 401 and a transparent sealant 403 that is disposed on the packaging substrate 401. As shown in FIG. 8D, the LED packaging structure 400 further includes at least one stacked structure 405, at least one first electrode 407, at least one second electrode 409, an isolation layer 411, and at least one conductive thin film layer 413. The stacked structure 405 is disposed on a first surface 401A of the packaging substrate 401 and its design is similar to that of the stacked structure 120 shown in FIG. 1C and is not repeated herein. The first electrode 407 is disposed on the first surface 401A and apart from the stacked structure 405. The isolation layer 411 is disposed on the first surface 401A and surrounds the stacked structure 405 as well as covers the lateral sides of the stacked structure 405, and the isolation layer 411 also fills the gap between the first and second electrodes 407 and 409. The conductive thin film layer 413 connects the first electrode 407 to the stacked structure 405. The second electrode 409 is disposed on the packaging substrate 401 and is electrically connected the stacked structure 405. Preferably, the second electrode 409 is disposed between the stacked structure 405 and the packaging substrate 401. The transparent sealant 403 covers the conductive thin film layer 413 as well as the isolation layer 411 for protecting the LED packaging structure 400.

The packaging substrate 401 is, for example, a semiconductor substrate that is electro-conductive, and its thickness is preferably greater than 300 micrometer for loading the components mentioned above. As shown in FIG. 8D, the LED packaging structure 400 further includes at least one ESD protection element 415 disposed under the first electrode 407 and embedded in the packaging substrate 401. The material of the packaging substrate 401 is not limited to be electro-conductive. For example, the packaging substrate 401 can also be any type of substrate such as metal-based substrate, silicon-based substrate, ceramic-based substrate, printed circuit board (PCB), flexible printed circuit board (FCB) etc.

As shown in FIG. 8E, the packaging substrate 401 includes two through holes 401B and 401C, which extend from the first surface 401A to a second surface 401D opposite the first surface 401A as well as correspond to the first electrode 407 and the second electrode 409 respectively. As the packaging substrate 401 is attached to other electronic device, the first electrode 407 and the second electrode 409 can be electrically connected to its driving source by the through holes 401B and 401C and two bonding pads 421 and 423. As the packaging substrate 401 is electro-conductive, the insulation of the through holes 401B and 401C should be considered. Preferably, another isolation layer 417 is disposed between the through holes 401B and 401C and the packaging substrate 401. However, as the packaging substrate 401 is formed by a non-conductive material such as ceramic, the isolation layer 417 and the ESD protection element 415 (shown in FIG. 8D) can be left out.

Figure 9:
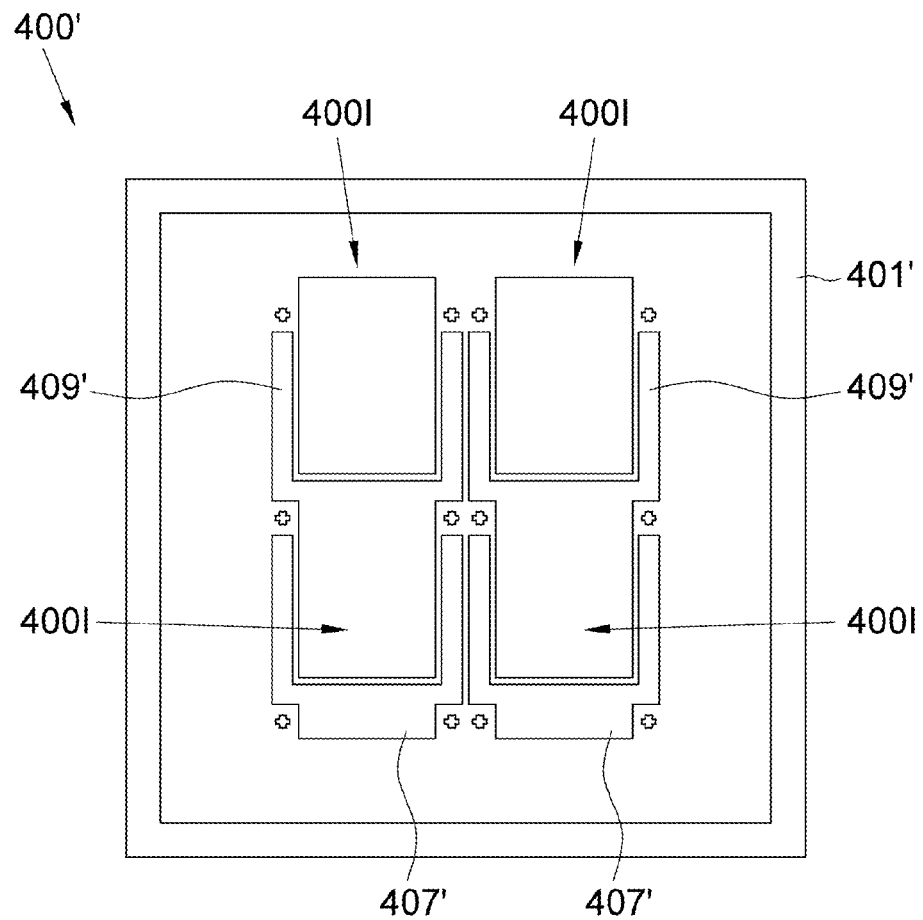
FIG. 9 is a diagram showing a LED packaging structure having a plurality of light emitting areas.

FIG. 9 is a diagram showing a LED packaging structure having a plurality of light emitting areas. The LED packaging structure 400' has a plurality of stacked structures (not shown), which are formed on the packaging substrate 401' and each correspond to one light emitting area 400I. A plurality of first electrodes 407' and a plurality of second electrodes 409' are disposed on the packaging substrate 401'. The LED packaging structure 400' provides a total light emitting area larger than that of the LED packaging structure 400 (shown in FIG. 8C).

Figure 10A:
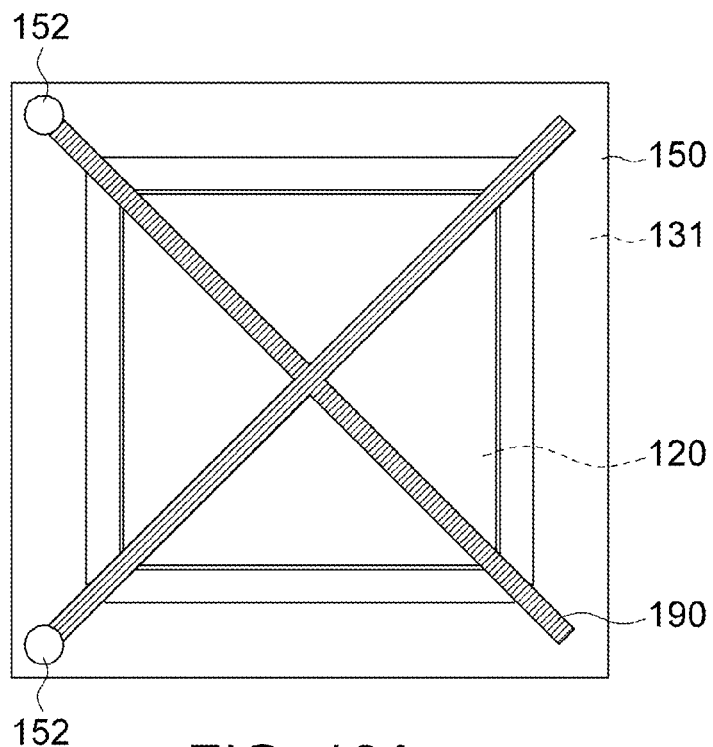
FIGS. 10A and 10B are diagrams each showing an auxiliary electrode disposed on the conductive thin film layer.
Figure 10B:
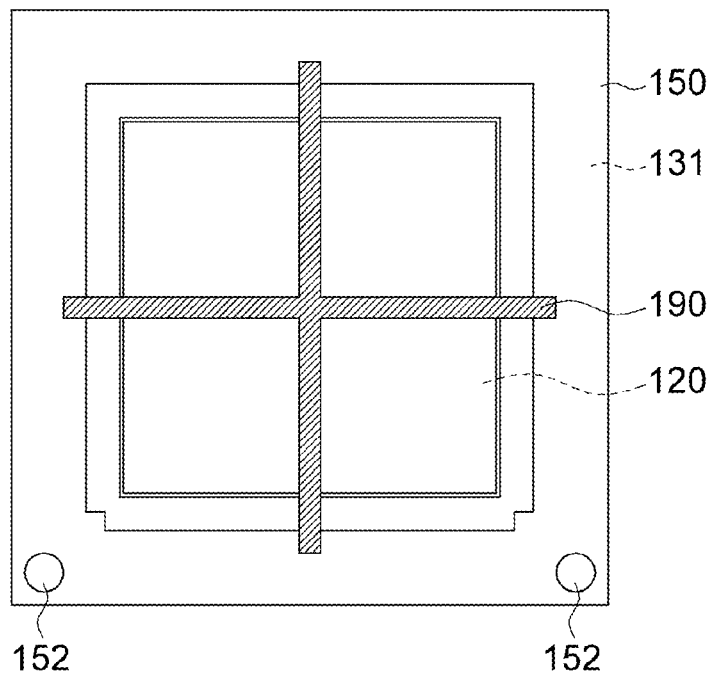

The connection between the stacked structure and the electrode makes use of the conductive thin film layer in the above embodiment. However, the electric current in the conductive thin film layer may not be always steady. Thus, an auxiliary electrode can be used to assist the electrical connection between the stacked structure and the electrode. FIGS. 10A and 10B are diagrams each showing an auxiliary electrode disposed on the conductive thin film layer. As shown in both FIGS. 10A and 10B, the auxiliary electrode 190 is disposed on the conductive thin film layer 150 and covers a part of the conductive thin film layer 150. The auxiliary electrode 190 is a cross structure for example, and the four ends of the cross structure correspond to the four corners (as shown in FIG. 10A) or four edges (as shown in FIG. 10B) of the conductive thin film layer 150, respectively, and extend to the electrode 131, thus the electrical connection between the stacked structure 120 and the electrode 131 is enhanced. Besides, the auxiliary electrode 190 can be further disposed along the lateral sides of the stacked structure 120. Furthermore, for increasing the attachment between the conductive thin film layer 150 and other elements such as metal bumps, a plurality of metal pads 152 are disposed on the conductive thin film layer 150.

Figure 11A:
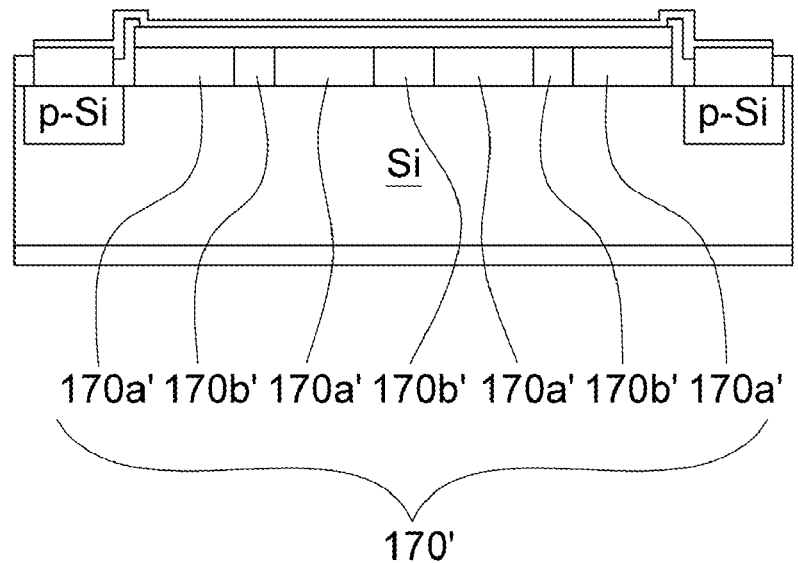
FIGS. 11A and 11B are diagrams each showing an interface layer having a plurality of partitions.
Figure 11B:
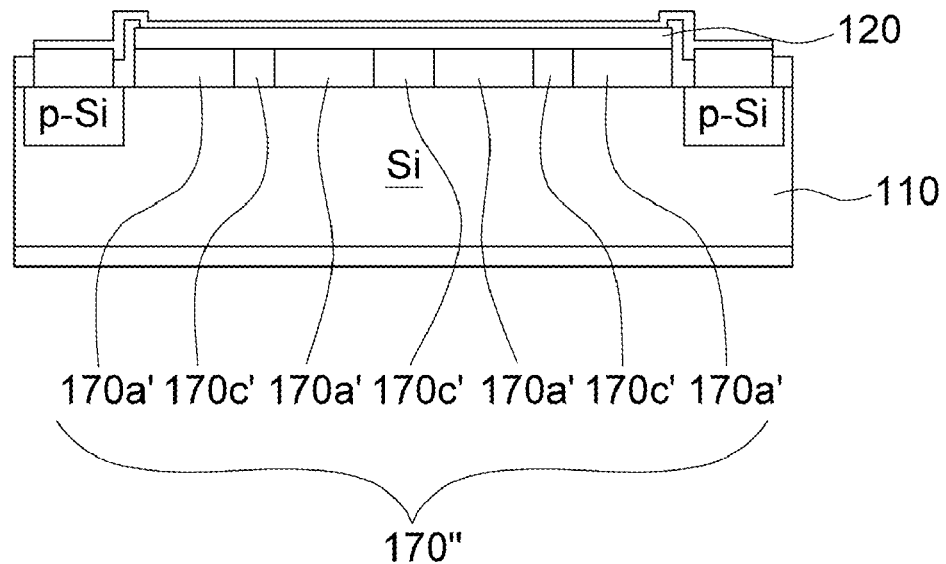

The interface layer used for combining the stacked structure with the sub-mount in the above embodiment totally fills the gap between the stacked structure and the sub-mount, however the disclosure is not limited thereto. FIGS. 11A and 11B are diagrams each showing an interface layer having a plurality of partitions. As shown in FIG. 11A, the interface layer 170' includes partitions 170a' that are separated by several vacancies 170b'. The interface layer 170' is easy to manufacture and the yield is thus increased. As shown in FIG. 11B, the interface layer 170'' includes partitions 170a', and each vacancy between two partitions 170a' is filled with a filling material 170c' such as resin or silicone.

The LED structure, LED packaging structure and method of forming a LED structure disclosed in the preferred embodiment of the disclosure have the electrode, which is mostly formed by opaque metal, disposed along the lateral sides of the stacked structure that emits light, so the electrode does not block the light from the stacked structure, rendering the LED structure fit for the requirement of a high light emitting device. Besides, the LED structure itself has an electrostatic discharge (ESD) protection element, which can be formed with the sub-mount of the LED structure, for ESD protection of the LED structure, thus neither additional ESD protection device nor conductive line needs to be assembled after the LED structure is fabricated. Therefore, the LED structure in the embodiment of the disclosure is simpler than a conventional LED device equipped with ESD protection device, facilitating the manufacturing process as well as saving the manufacturing cost.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode (LED) structure, comprising:
   a sub-mount having a first surface and a second surface opposite the first surface;
   a stacked structure comprising a first semiconductor layer, an active layer, and a second semiconductor layer laminated on the first surface;
   a first electrode disposed along at least three lateral sides of the stacked structure on the first surface;
   an isolation layer disposed on the first surface, wherein the isolation layer surrounds the stacked structure and covers the lateral sides of the active layer; and
   a conductive thin film layer for connecting the first electrode to the stacked structure, wherein the conductive thin film layer covers the stacked structure and the conductive thin film layer is on top of the first electrode, and the light transmittance of the conductive thin film layer for a primary wavelength of a light generated by the active layer is greater than 60%.

2. The LED structure according to claim 1, further comprising:
   an electrostatic discharge (ESD) protection element disposed under the first electrode and embedded in the sub-mount.

3. The LED structure according to claim 2, wherein the material of the ESD protection element is p-type silicon.

4. The LED structure according to claim 1, further comprising:
a second electrode disposed on the second surface of the sub-mount.

5. The LED structure according to claim 4, wherein the material of the sub-mount is a doped semiconductor.

6. The LED structure according to claim 1, wherein the first electrode is disposed along all the lateral sides of the active layer.

7. The LED structure according to claim 1, wherein the first electrode is disposed along three of the lateral sides of the stacked structure.

8. The LED structure according to claim 1, further comprising:
an interface layer disposed between the stacked structure and the sub-mount.

9. The LED structure according to claim 8, wherein the interface layer comprises a metal reflector for reflecting the light generated by the active layer.

10. The LED structure according to claim 8, wherein the interface layer comprises an adhesive for combining the stacked structure and the sub-mount.

11. The LED structure according to claim 8, wherein the interface layer comprises a plurality of unconnected partitions.

12. The LED structure according to claim 1, wherein the sub-mount further comprises a cavity on the first surface for receiving the stacked structure.

13. The LED structure according to claim 12, further comprising:
a phosphor filling the cavity and covering the stacked structure.

14. The LED structure according to claim 1, wherein the conductive thin film layer comprises a plurality of openings corresponding to the stacked structure.

15. The LED structure according to claim 1, wherein the conductive thin film layer comprises a plurality of concaves corresponding to the stacked structure.

16. The LED structure according to claim 1, wherein the conductive thin film layer comprises a light extracting feature corresponding to the stacked structure.

17. The LED structure according to claim 1, wherein the material of the conductive thin film layer is selected from one group consisted of $In_2O_3$, $SnO_2$, ZnO, CdO, TiN, $In_2O_3$:Sn (ITO), ZnO:In(IZO), ZnO:Ga(GZO), ZnO:Al(AZO), $SnO_2$:F, $TiO_2$:Ta, $In_2O_3$—ZnO, $CdIn_2O_4$, $Cd_2SnO_4$, $Zn_2SnO_4$, $Mg(OH)_2$—C, ITO, IZO, GZO, AZO, ATO, FTO, NiO, and an allay consisted of the above elements.

18. The LED structure according to claim 1, wherein the material of the conductive thin film layer is selected from one group consisted of ITO, IZO, GZO, AZO, ATO, FTO, NiO, and an alloy consisted of the above elements.

19. The LED structure according to claim 1, further comprising:
a second electrode disposed apart from the stacked structure on the first surface of the sub-mount.

20. The LED structure according to claim 19, wherein the material of the sub-mount is an un-doped semiconductor.

21. The LED structure according to claim 1, further comprising:
an auxiliary electrode disposed on the conductive thin film layer for connecting the first electrode to the stacked structure, wherein the auxiliary electrode covers a part of the conductive thin film layer.

22. A LED packaging structure, comprising:
a packaging substrate; at least one stacked structure disposed on the packaging substrate, wherein the at least one stacked structure comprises a first semiconductor layer, an active layer and a second semiconductor layer laminated on a first surface of the packaging substrate;
at least one first electrode disposed along at least three lateral sides of the at least one stacked structure on the first surface;
at least one second electrode disposed on the packaging substrate and electrically connected to the at least one stacked structure;
an isolation layer disposed on the first surface, wherein the isolation layer surrounds the at least one stacked structure and covers the lateral sides of the active layer;
at least one conductive thin film layer for connecting the at least one first electrode to the at least one stacked structure, wherein the at least one conductive thin film layer covers the at least one stacked structure and the conductive thin film layer is on top of the first electrode, and the light transmittance of the at least one conductive thin film layer for a primary wavelength of a light generated by the active layer is greater than 60%; and
a transparent sealant covering the at least one conductive thin film layer.

23. The LED packaging structure according to claim 22, wherein the packaging substrate is a semiconductor substrate, and the LED packaging structure further comprises:
at least one electrostatic discharge (ESD) protection element disposed under the at least one first electrode and embedded in the packaging substrate.

24. The LED packaging structure according to claim 23, wherein the material of the ESD protection element is a p-type silicon.

25. The LED packaging structure according to claim 22, wherein the second electrode is disposed between the packaging substrate and the stacked structure.

26. The LED packaging structure according to claim 22, wherein the at least one first electrode is disposed along all the lateral sides of the active layer.

27. The LED packaging structure according to claim 22, wherein the at least one first electrode is disposed along three of the lateral sides of the at least one stacked structure.

28. The LED packaging structure according to claim 22, further comprising:
an interface layer disposed between the least one stacked structure and the packaging substrate.

29. The LED packaging structure according to claim 28, wherein the interface layer comprises a metal reflector for reflecting the light generated by the active layer.

30. The LED packaging structure according to claim 28, wherein the interface layer comprises an adhesive for combining the at least one stacked structure and the packaging substrate.

31. The LED packaging structure according to claim 28, wherein the interface layer comprises a plurality of unconnected partitions.

32. The LED packaging structure according to claim 22, wherein the packaging substrate further comprises a cavity on the first surface for receiving the at least one stacked structure.

33. The LED packaging structure according to claim 32, further comprising:
a phosphor filling the cavity and covering the at least one stacked structure.

34. The LED packaging structure according to claim 22, wherein the at least one conductive thin film layer comprises a plurality of openings corresponding to the at least one stacked structure.

35. The LED packaging structure according to claim 22, wherein the at least one conductive thin film layer comprises a plurality of concaves corresponding to the at least one stacked structure.

36. The LED packaging structure according to claim 22, wherein the at least one conductive thin film layer comprises a light extracting feature corresponding to the at least one stacked structure.

37. The LED packaging structure according to claim 22, wherein the material of the at least one conductive thin film layer is selected from one group consisted of $In_2O_3$, $SnO_2$, ZnO, CdO, TiN, $In_2O_3$:Sn(ITO), ZnO:In(IZO), ZnO:Ga (GZO), ZnO:Al(AZO), $SnO_2$:F, TiO2:Ta, $In_2O_3$—ZnO, $CdIn_2O_4$, $Cd_2SnO_4$, $Zn_2SnO_4$, $Mg(OH)_2$—C, ITO, IZO, GZO, AZO, ATO, FTO, NiO, and an allay consisted of the above elements.

38. The LED packaging structure according to claim 22, wherein the material of the at least one conductive thin film layer is selected from one group consisted of ITO, IZO, GZO, AZO, ATO, FTO, NiO, and an alloy consisted of the above elements.

39. The LED packaging structure according to claim 22, further comprising:
  at least one auxiliary electrode disposed on the at least one conductive thin film layer for connecting the at least one first electrode to the at least one stacked structure, wherein the at least one auxiliary electrode covers a part of the at least one conductive thin film layer.

40. The LED packaging structure according to claim 22, wherein the packaging substrate comprises two through holes extending from the first surface to a second surface opposite the first surface, and the two through holes correspond to the first electrode and the second electrode respectively.

* * * * *